(12) United States Patent
Pal

(10) Patent No.: US 7,193,850 B2
(45) Date of Patent: Mar. 20, 2007

(54) INTEGRATED HEAT REMOVAL AND VIBRATION DAMPING FOR AVIONIC EQUIPMENT

(75) Inventor: Debabrata Pal, Hoffman Estates, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 290 days.

(21) Appl. No.: 10/930,127

(22) Filed: Aug. 31, 2004

(65) Prior Publication Data

US 2006/0044760 A1   Mar. 2, 2006

(51) Int. Cl.
    *H05K 7/20*  (2006.01)
(52) U.S. Cl. ............... 361/700; 165/80.4; 165/104.33; 174/15.2
(58) Field of Classification Search ............... None
See application file for complete search history.

(56) References Cited

U.S. PATENT DOCUMENTS

| | | | |
|---|---|---|---|
| 4,153,225 A | 5/1979 | Paulsen | |
| 5,019,939 A * | 5/1991 | Reimer | 361/721 |
| 5,262,587 A * | 11/1993 | Moser | 174/15.1 |
| 5,414,592 A * | 5/1995 | Stout et al. | 361/704 |
| 5,424,916 A * | 6/1995 | Martin | 361/698 |
| 5,485,671 A * | 1/1996 | Larson et al. | 29/890.032 |
| 6,008,987 A * | 12/1999 | Gale et al. | 361/700 |
| 6,212,074 B1 | 4/2001 | Gonsalves et al. | |
| 6,339,211 B1 | 1/2002 | Foote et al. | |
| 6,385,044 B1 | 5/2002 | Colbert et al. | |
| 6,839,235 B2 * | 1/2005 | St. Louis et al. | 361/700 |
| 6,873,528 B2 * | 3/2005 | Hulan et al. | 361/719 |

* cited by examiner

*Primary Examiner*—Boris Chervinsky
(74) *Attorney, Agent, or Firm*—Carlson, Gaskey & Olds

(57) ABSTRACT

An electronic equipment rack system supports a printed wire board (PWB) assembly having a structural stiffener with a heat pipe mounted therein. The heat pipe is mounted within the structural stiffener directly adjacent the printed wire board to conduct thermal energy away from the electronic components on the printed wire board.

21 Claims, 7 Drawing Sheets

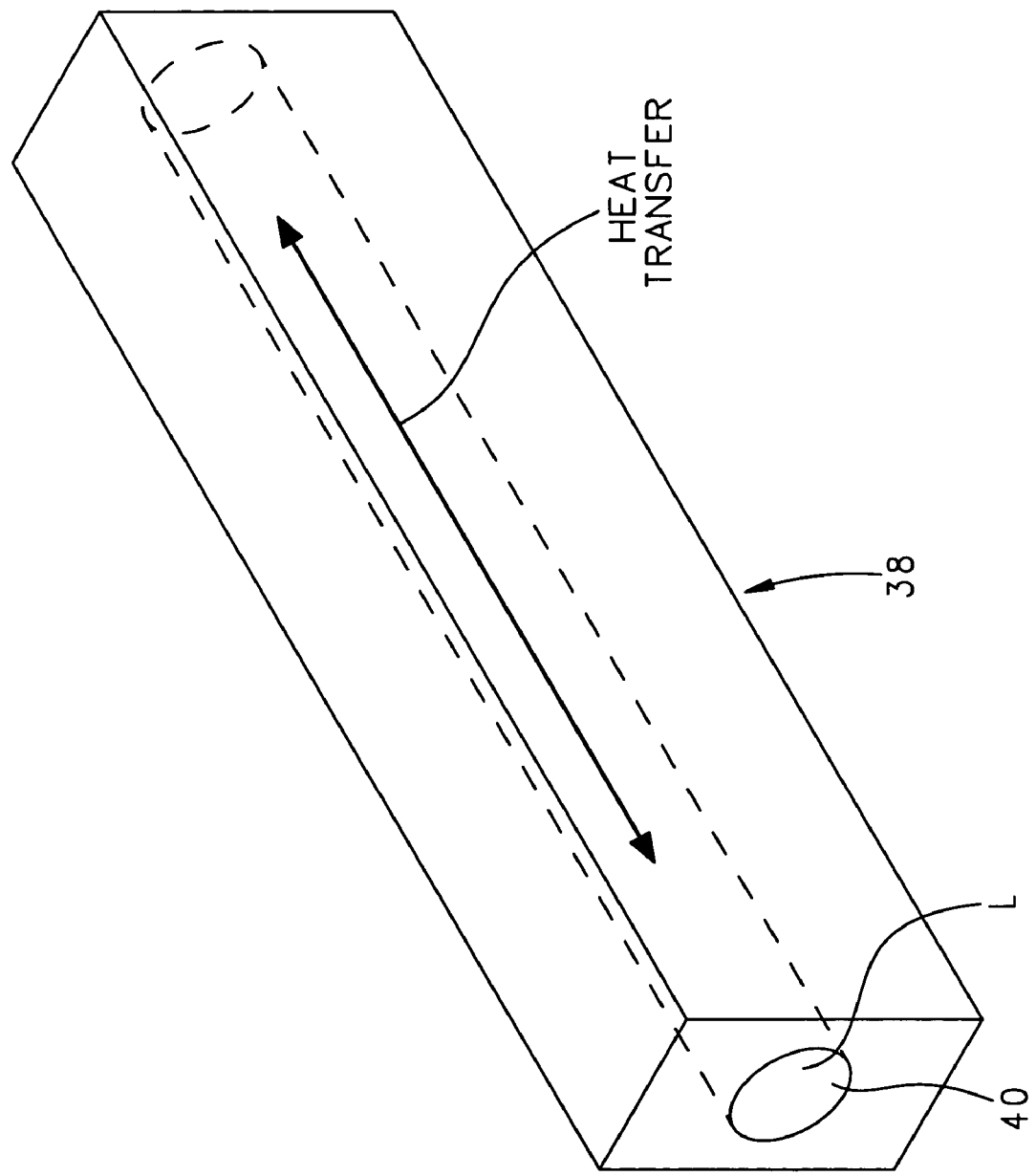

US 7,193,850 B2

INTEGRATED HEAT REMOVAL AND VIBRATION DAMPING FOR AVIONIC EQUIPMENT

BACKGROUND OF THE INVENTION

The present invention relates to the mounting of electrical and electronic equipment, and more particularly to mounting and thermal management of avionic systems.

Avionic systems are mounted within an aircraft electronics bay to provide reliability and serviceability. Significant considerations of avionic system mounting are the thermal management and structural support thereof.

Avionic systems commonly include a multitude of printed wiring board assemblies (PWBs) mounted within electronic equipment racks. The construction of the racks typically includes integrated thermal management schemes such as edge cooling. Edge-cooling allows the heat produced in an electronic circuit to be rejected by conduction through the PWB surface and communicated to the PWB edges. The PWB edges are mounted in the rack and are cooled by flowing liquid or air adjacent thereto. Depending on the required heat dissipation level of the electronic circuit, additional cooling conductors such as an aluminum core, a flow-through module, and high conductivity graphite cores may be located within the PWB. Although providing effective thermal management, incorporating additional cooling conductors within the PWBs may significantly increase the manufacturing expense and weight of each PWB.

To minimize the weight thereof, PWBs are manufactured as relatively thin structures. However, the thinness of the PWBs results in a relatively flexible structure which may deflect in response to the vibratory inputs of typical aircraft operating environments. To minimize excessive deflection of the PWB assembly, structural stiffeners such as metallic bars are commonly mounted to the PWB surface. Although effective at adding stiffness to the PWB, conventional structural stiffeners are of a thin construction to also minimize weight. This thinness results in minimal thermal transfer. However, increasing the size of the structural stiffener to provide thermal transfer through conduction would result in an undesirable weight increase.

Accordingly, it is desirable to provide an electronic equipment rack system which increases the thermal management and structural support of a printed wiring board in an inexpensive and lightweight package.

SUMMARY OF THE INVENTION

The electronic equipment rack system according to the present invention provides a printed wire board (PWB) assembly having a structural stiffener with a heat pipe mounted therein. The heat pipe is mounted within the structural stiffener directly adjacent the printed wire board to conduct thermal energy away from the electronic components on the printed wire board.

Each end segment of the heat pipe is crimped and extends through the structural stiffener along an edge of the printed wire board. A wedge lock fastener retains the crimped heat pipe end segment and the printed wire board edge within a slot formed in a heat exchanger embedded within opposed rails of a rack. The heat pipe communicates thermal energy to the heat exchangers to provide edge cooling.

The present invention therefore provides an electronics equipment rack system which increases the thermal management and structural support of a printed wiring board in an inexpensive and lightweight package.

BRIEF DESCRIPTION OF THE DRAWINGS

The various features and advantages of this invention will become apparent to those skilled in the art from the following detailed description of the currently preferred embodiment. The drawings that accompany the detailed description can be briefly described as follows:

FIG. 6A is a cross-sectional view of a round heat pipe integrated within a generally rectilinear structural stiffener.

DETAILED DESCRIPTION OF THE PREFERRED EMBODIMENT

Figure 1:
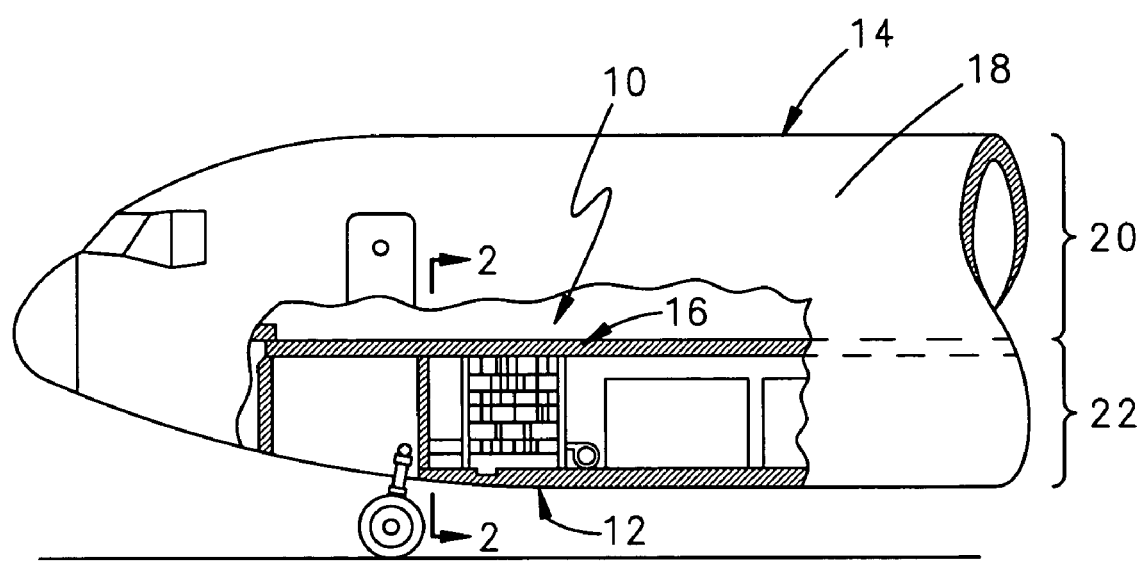
FIG. 1 is an elevational view of the forward portion of an aircraft fuselage to show the interior arrangement of an avionics bay.

FIG. 1 illustrates a general schematic view of an avionics system 10 mounted with an avionics bay 12 of an aircraft 14. It should be understood that various locations for the avionics bay will benefit from the present invention and that the present invention is not limited to just aircraft environments as various vehicles and stationary emplacements which utilize electronic mountings will benefit from the present invention.

Typically, the aircraft includes a horizontal deck 16 that extends substantially along the length of an aircraft fuselage 18 to divide the fuselage into an upper, passenger carrying lobe 20 and a lower equipment and cargo lobe 22. The avionics bay 12 is typically positioned within the lower lobe 22. It should be understood that although a particular component arrangement for mounting in a rack is disclosed in the illustrated embodiment, other arrangements will benefit from the instant invention.

Figure 2:
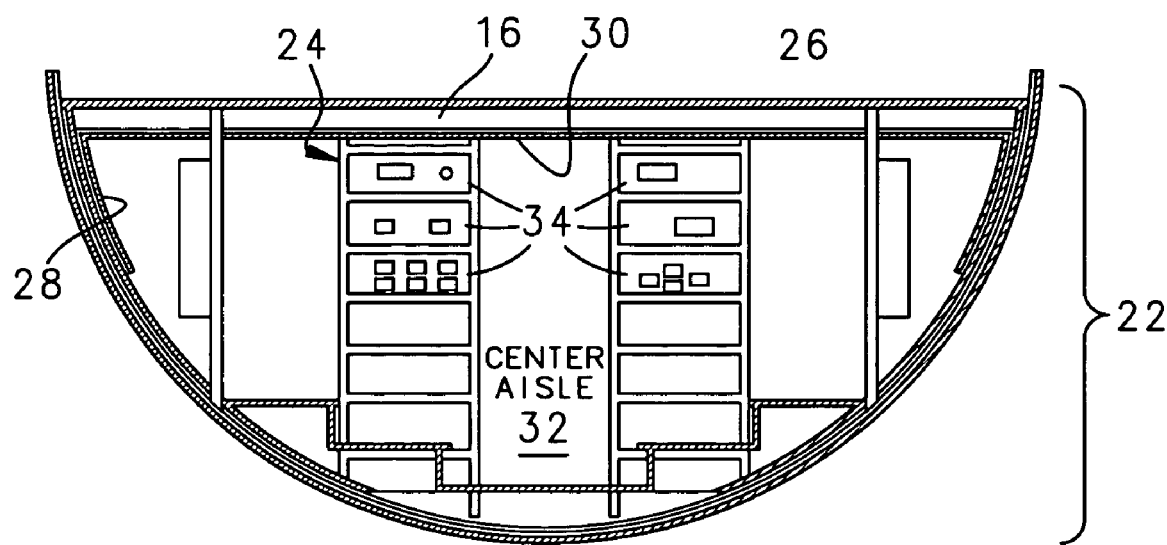
FIG. 2 is a cross-sectional view taken along the line 2—2 of FIG. 1 to show a view of the avionics bay that would be seen from a forward part of the bay looking aft.

Referring to FIG. 2, the bay 12 includes two electronic equipment racks 24, 26 each mounted generally upright between the contoured interior wall portion 28 of the lower lobe 22 and a bay ceiling 30 defined by the underside of the deck 16. The racks 24, 26 are disposed on opposite sides of a central access aisle 32 to support a multiple of printed wire board (PWB) assemblies 34.

Figure 3:
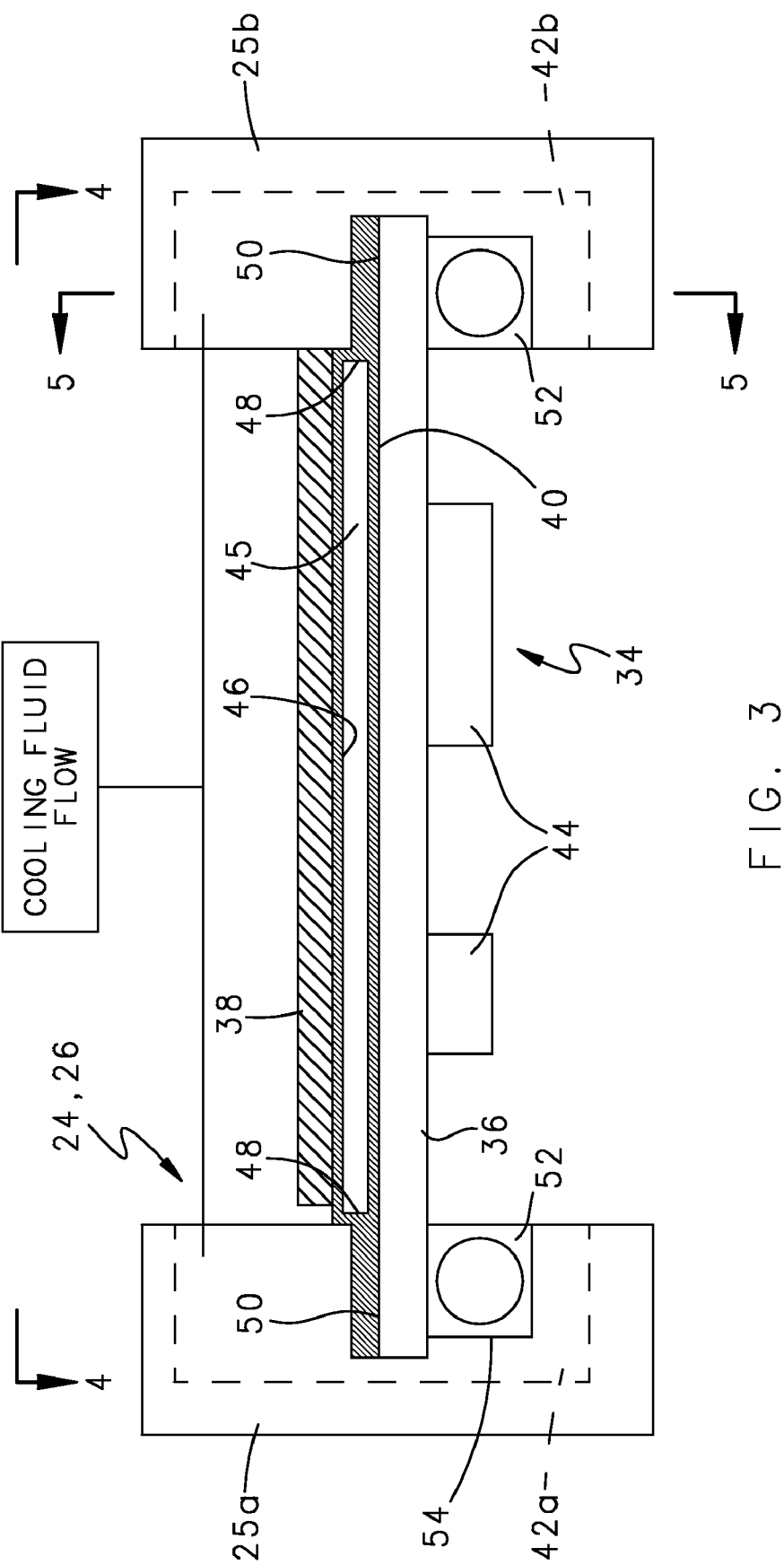
FIG. 3 is a sectional view of an electronics rack system taken transverse to a printed wire board (PWB) along a structural stiffener according to the present invention.

Referring to FIG. 3, a sectional view of one PWB assembly 34 mounted within the rack 24 is illustrated. Although only rack 24 will be described, it should be understood that rack 26 as well as mounting systems other than racks may also be utilized with the present invention. It should be understood that any circuit board, or relatively thin electronic component arrangement will benefit from the present invention. Preferably, the PWB assembly 34 is slid into position.

The rack 24 preferably includes a pair of opposed rails 25a, 25b in which a heat exchanger 42a, 42b is respectively embedded to communicate a cooling fluid flow (illustrated schematically) to the PWB assembly 34. The heat exchangers 42a, 42b receive thermal energy from the PWB assembly 34 and the electronic components (illustrated schematically at 44) mounted thereon. The heat exchangers 42a, 42b are illustrated schematically to show that various edge cooling methods may be utilized in combination with the present invention. Each heat exchanger 42a, 42b is preferably a liquid-air and/or air-air heat exchanger, however, other thermal management schemes including conduction will alternatively or additionally benefit from the present invention.

The PWB assembly 34 includes a printed wire board 36, a structural stiffener 38, and a heat pipe 40. The printed wire board 36 is a generally thin planar member which supports the heat generating electronic components 44 (also illustrated in FIG. 4). The heat pipe defines a hollow interior 45 with sealed end segments 48. The heat pipe 40 is at least partially filled with a liquid L such as deionized water to provide a two-phase heat transfer which enhances heat removal. A partial vacuum may lower the boiling point of the liquid L.

Each heat pipe end segment 48 of the heat pipe 40 is preferably crimped to a generally planar shaped segment. That is, each heat pipe end segment 48 is crimped to be located flat against the printed wire board 36. The heat pipe end segment 48 is located adjacent a printed wire board edge 50.

The structural stiffener 38 locates the heat pipe 40 along the span of the printed wire board 36 through fasteners or bonding to conduct heat toward the printed wire board edge 50 where the heat can be removed by the heat exchangers 42a, 42b and cooling fluid flow therethrough. Preferably, the heat pipe 40 is maintained in direct contact with the printed wire board 36 through the force exerted by the structural stiffener 38.

Figure 5:
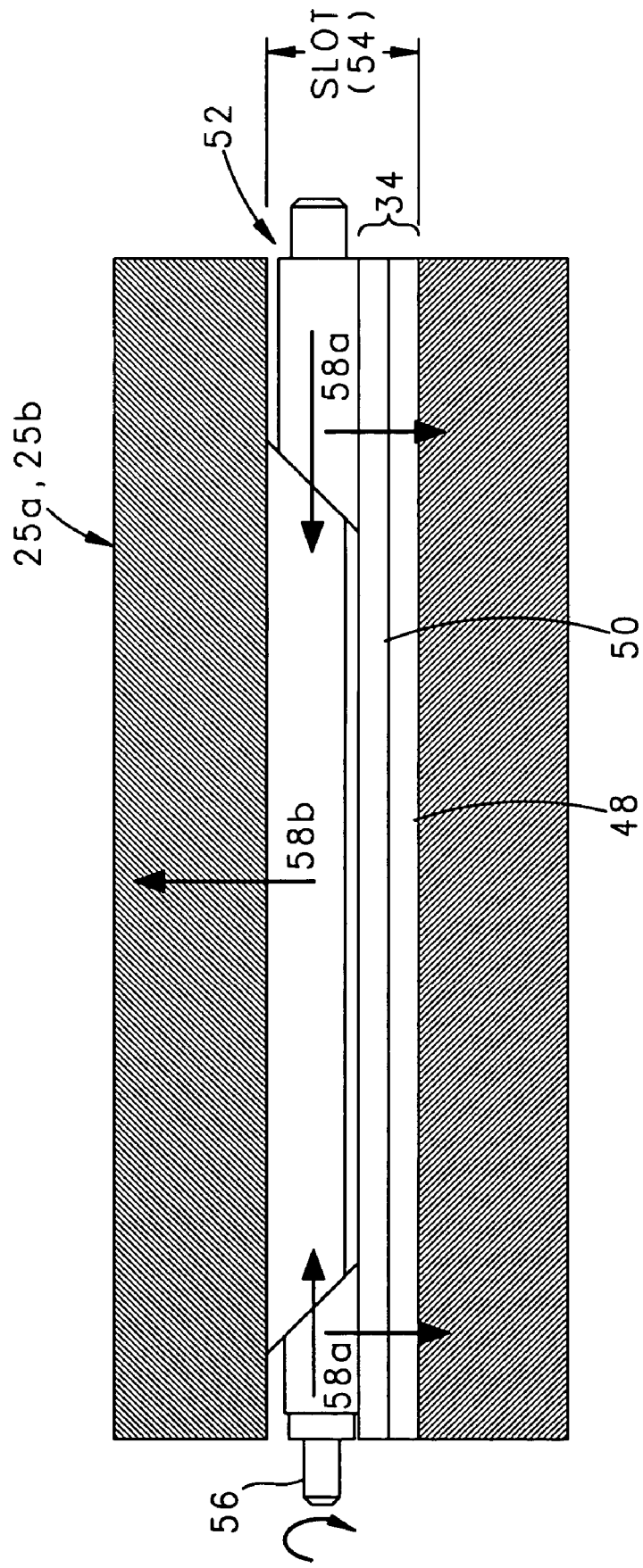
FIG. 5 is a sectional view of a wedge lock fastener which retains a PWB within a heat exchanger embedded within an electronics rack system.

A wedge lock fastener 52 retains the heat pipe end segment 46 and the printed wire board edge 50 within a slot 54 formed in each heat exchanger 42a, 42b. In general, a wedge lock end screw 56 is rotated to provide relative movement between the wedges 58a, 58b to trap the heat pipe end segment 48 and printed wire board edge 50 within the slot 54 (FIG. 5).

Figure 6B:
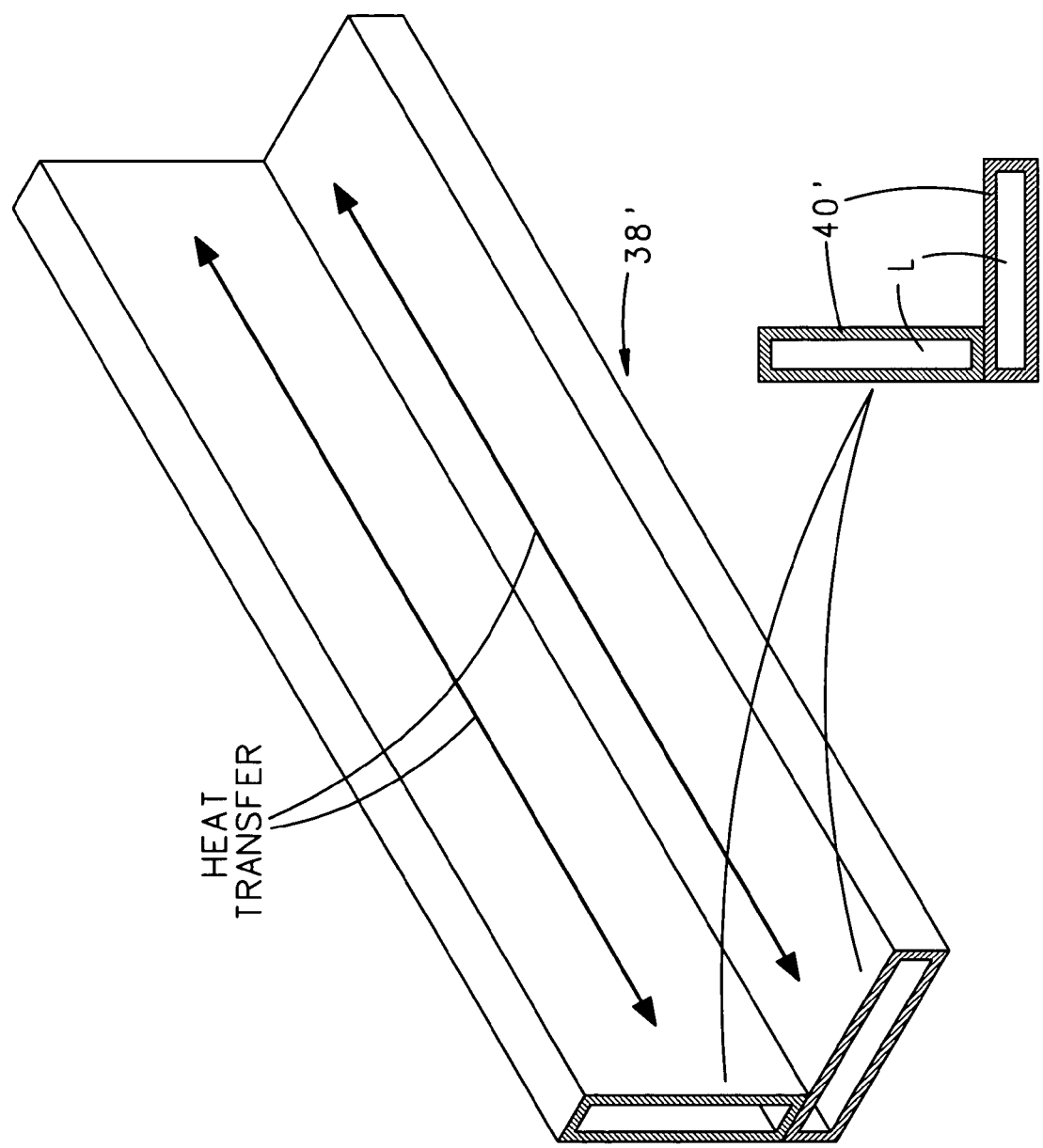
FIG. 6B is a cross-sectional view of a rectilinear heat pipe integrated within a generally L-shaped structural stiffener

The heat pipe 40 is mounted within the structural stiffener 38 directly adjacent the printed wire board 36. Preferably, the heat pipe 40 is tubular and round in cross-section such that the heat pipe 40 fits within a generally rectilinear structural stiffener 38 (FIG. 6A). Alternatively, a rectilinear heat pipe 40' is formed as a portion of an L-shaped structural stiffener 38 (FIG. 6B). The structural stiffener 38 supports the printed wire board 36 to increase the rigidity thereof while the heat pipe 40 provides heat transfer in the axial direction thereof.

Figure 4:
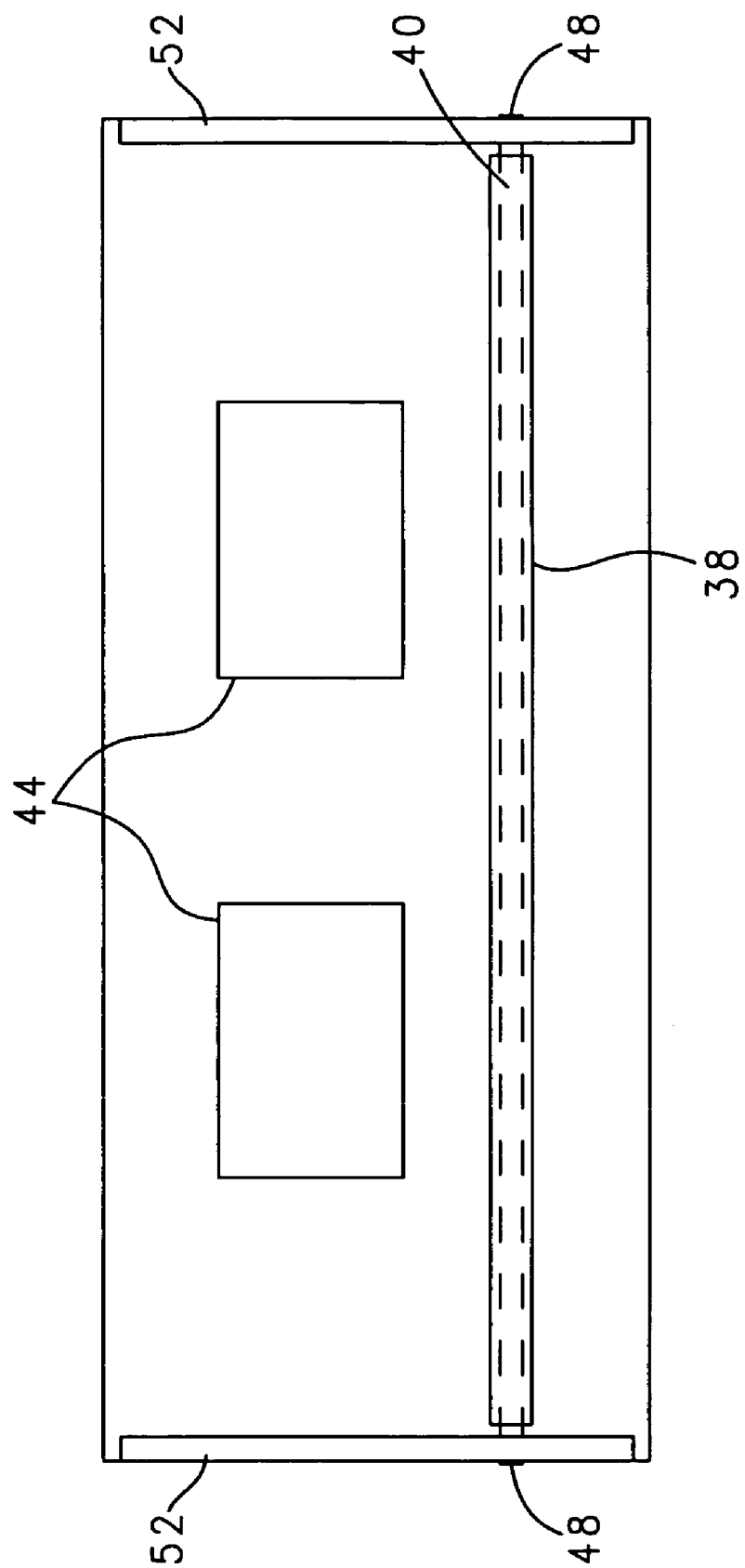
FIG. 4 is a planar view of a printed wire board mounted in an electronics rack according to the present invention.

Preferably, the structural stiffener 38 does not extend the full axial length between the heat exchanger 42a, 42b to accommodate thermal expansion and tolerance variations. That is, the structural stiffener 38 may contact one side of the heat exchanger 42a, while the heat pipe end segment 46 contacts both heat exchangers 42a, 42b (FIGS. 3 and 4).

The integration of the heat pipe 40 in the structural stiffener 38 combined with the heat transfer of the printed wire board 36 itself, increases the over heat rejection capability of PWB assembly 34 in an inexpensive and compact package.

The foregoing description is exemplary rather than defined by the limitations within. Many modifications and variations of the present invention are possible in light of the above teachings. The preferred embodiments of this invention have been disclosed, however, one of ordinary skill in the art would recognize that certain modifications would come within the scope of this invention. It is, therefore, to be understood that within the scope of the appended claims, the invention may be practiced otherwise than as specifically described. For that reason the following claims should be studied to determine the true scope and content of this invention.

What is claimed is:

1. A printed wire board assembly comprising:
   a printed wire board defining a printed wire board edge;
   a structural stiffener mounted to said printed wire board;
   a heat pipe mounted at least partially within said structural stiffener; and
   a heat exchanger in thermal communication with a crimped segment of said heat pipe adjacent said printed wire board edge.

2. The printed wire board assembly as recited in claim 1, wherein said printed wire board edge is engaged with said heat exchanger.

3. The printed wire board assembly as recited in claim 2, wherein said heat exchanger is mounted within a rack which communicates cooling fluid therethrough, said cooling fluid in thermal communication with said heat pipe adjacent said printed wire board edge.

4. The printed wire board assembly as recited in claim 3, wherein said heat pipe includes a crimped segment.

5. The printed wire board assembly as recited in claim 4, further comprising a wedge lock fastener engageable with said crimped segment of said heat pipe and said edge of said printed wire board.

6. The printed wire board assembly as recited in claim 1, wherein said heat pipe includes a crimped segment at each end thereof.

7. The printed wire board assembly as recited in claim 1, wherein said heat pipe spans said printed wire board.

8. The printed wire board assembly as recited in claim 1, wherein said structural stiffener is generally rectangular in cross-section.

9. The printed wire board assembly as recited in claim 1, wherein said structural stiffener is generally L-shaped in cross-section.

10. An electronic equipment rack system comprising:
    a heat exchanger;
    a printed wire board defining a printed wire board edge;
    a structural stiffener mounted to said printed wire board; and
    a heat pipe mounted at least partially within said structural stiffener and in contact with said printed wire board, said heat pipe including a heat pipe crimped segment adjacent said printed wire board edge, said printed wire board edge and said heat pipe crimped segment at least partially receivable into said heat exchanger.

11. The electronic equipment rack system as recited in claim 10, further comprising a wedge lock fastener which retains said printed wire board edge within said heat exchanger.

12. The electronic equipment rack system as recited in claim 10, further comprising a wedge lock fastener which retains said heat pipe crimped segment within said heat exchanger.

13. The electronic equipment rack system as recited in claim 10, further comprising a wedge lock fastener which retains said printed wire board edge and said heat pipe crimped segment within said heat exchanger.

14. The electronic equipment rack system as recited in claim 10, wherein said structural stiffener is generally rectangular in cross-section.

15. The electronic equipment rack system as recited in claim 10, wherein said structural stiffener is generally L-shaped in cross-section.

16. The electronic equipment rack system as recited in claim 10, wherein said heat exchanger is embedded into a rail of a rack.

17. A method of manufacturing a printed wire board assembly comprising the steps of:
   (1) mounting a structural stiffener to a printed wire board such that a heat pipe mounted at least partially within said structural stiffener contacts the printed wire board; and
   (2) crimping an end segment of the heat pipe adjacent a printed wire board edge.

18. A method as recited in claim 17, further comprising the step of:
   crimping the end segment into a planar shaped segment.

19. An electronic equipment rack system comprising:
   an electronic equipment rack;
   a printed wire board defining a printed wire board edge;
   a heat pipe mounted to said printed wire board; and
   a heat exchanger mounted within said electronic equipment rack which communicates a cooling fluid therethrough, said cooling fluid in thermal communication with said heat pipe adjacent said printed wire board edge.

20. An electronic equipment rack system as recited in claim 19, wherein said heat pipe includes a heat pipe crimp segment adjacent said printed wire board edge.

21. An electronic equipment rack system as recited in claim 19, wherein said cooling fluid is communicated through said electronic equipment rack generally transverse to said heat pipe.

* * * * *